(12) United States Patent
Kuroki

(10) Patent No.: US 9,548,259 B2
(45) Date of Patent: *Jan. 17, 2017

(54) SEMICONDUCTOR DEVICE AND METHOD FOR MANUFACTURING THE SAME

(71) Applicant: PS4 Luxco S.a.r.l., Luxemborg (LU)

(72) Inventor: Keiji Kuroki, Tokyo (JP)

(73) Assignee: Longitude Semiconductor S.a.r.l., Luxembourg (LU)

( * ) Notice: Subject to any disclaimer, the term of this patent is extended or adjusted under 35 U.S.C. 154(b) by 0 days.

This patent is subject to a terminal disclaimer.

(21) Appl. No.: 14/246,505

(22) Filed: Apr. 7, 2014

(65) Prior Publication Data

US 2014/0299926 A1 Oct. 9, 2014

Related U.S. Application Data

(63) Continuation of application No. 12/711,551, filed on Feb. 24, 2010, now Pat. No. 8,729,618.

(30) Foreign Application Priority Data

Mar. 13, 2009 (JP) .................................. 2009-061512

(51) Int. Cl.
| | | |
|---|---|---|
| *H01L 27/108* | (2006.01) | |
| *H01L 23/48* | (2006.01) | |
| *H01L 21/285* | (2006.01) | |
| *H01L 21/768* | (2006.01) | |
| *H01L 29/66* | (2006.01) | |
| *H01L 29/78* | (2006.01) | |

(52) U.S. Cl.
CPC ....... *H01L 23/481* (2013.01); *H01L 21/28525* (2013.01); *H01L 21/76877* (2013.01); *H01L 21/76895* (2013.01); *H01L 21/76897* (2013.01); *H01L 27/10855* (2013.01); *H01L 27/10888* (2013.01); *H01L 29/66477* (2013.01); *H01L 29/78* (2013.01); *H01L 2924/0002* (2013.01)

(58) Field of Classification Search
CPC ................... H01L 2924/0002; H01L 2924/00; H01L 21/28525; H01L 21/76877; H01L 21/76895; H01L 21/76897; H01L 23/481; H01L 27/10855; H01L 27/10888; H01L 29/66477; H01L 29/78
USPC .................................................. 257/296–311
See application file for complete search history.

(56) References Cited

U.S. PATENT DOCUMENTS

| | | | | |
|---|---|---|---|---|
| 5,599,723 A * | 2/1997 | Sato | ................. | H01L 29/66242 148/DIG. 10 |
| 6,417,534 B2 * | 7/2002 | Nakahata | .......... | H01L 21/28525 257/306 |
| 7,199,420 B2 * | 4/2007 | Kitamura | .......... | H01L 27/10894 257/296 |
| 8,426,926 B2 * | 4/2013 | Shin | .................... | H01L 29/6653 257/396 |

(Continued)

*Primary Examiner* — Mohammed Shamsuzzaman

(57) ABSTRACT

A method for manufacturing a semiconductor device comprises forming a first layer on an impurity diffusion region in a semiconductor substrate by a selective epitaxial growth method, forming a second layer on the first layer by the selective epitaxial growth method, forming a contact hole penetrating an interlayer insulating film in a thickness direction thereof and reaching the second layer, and filling a conductive material into the contact hole to form a contact plug including the first and second layers and the conductive material.

17 Claims, 15 Drawing Sheets

(56) References Cited

U.S. PATENT DOCUMENTS

| | | | | |
|---|---|---|---|---|
| 2003/0216030 A1* | 11/2003 | Kim | .................. | H01L 27/10888 438/629 |
| 2004/0063313 A1* | 4/2004 | Shiratake | .......... | H01L 21/76897 438/672 |
| 2004/0180543 A1* | 9/2004 | Lee | .................. | H01L 21/28518 438/683 |
| 2005/0087880 A1* | 4/2005 | Kujirai | .............. | H01L 21/28061 257/758 |
| 2005/0095793 A1* | 5/2005 | Lee | .................. | H01L 29/41791 438/294 |
| 2005/0245073 A1* | 11/2005 | Lee | .................. | H01L 21/02063 438/629 |
| 2007/0059888 A1* | 3/2007 | Sukekawa | ......... | H01L 21/28525 438/279 |
| 2007/0224753 A1* | 9/2007 | Tang | ................ | H01L 27/10876 438/212 |

* cited by examiner

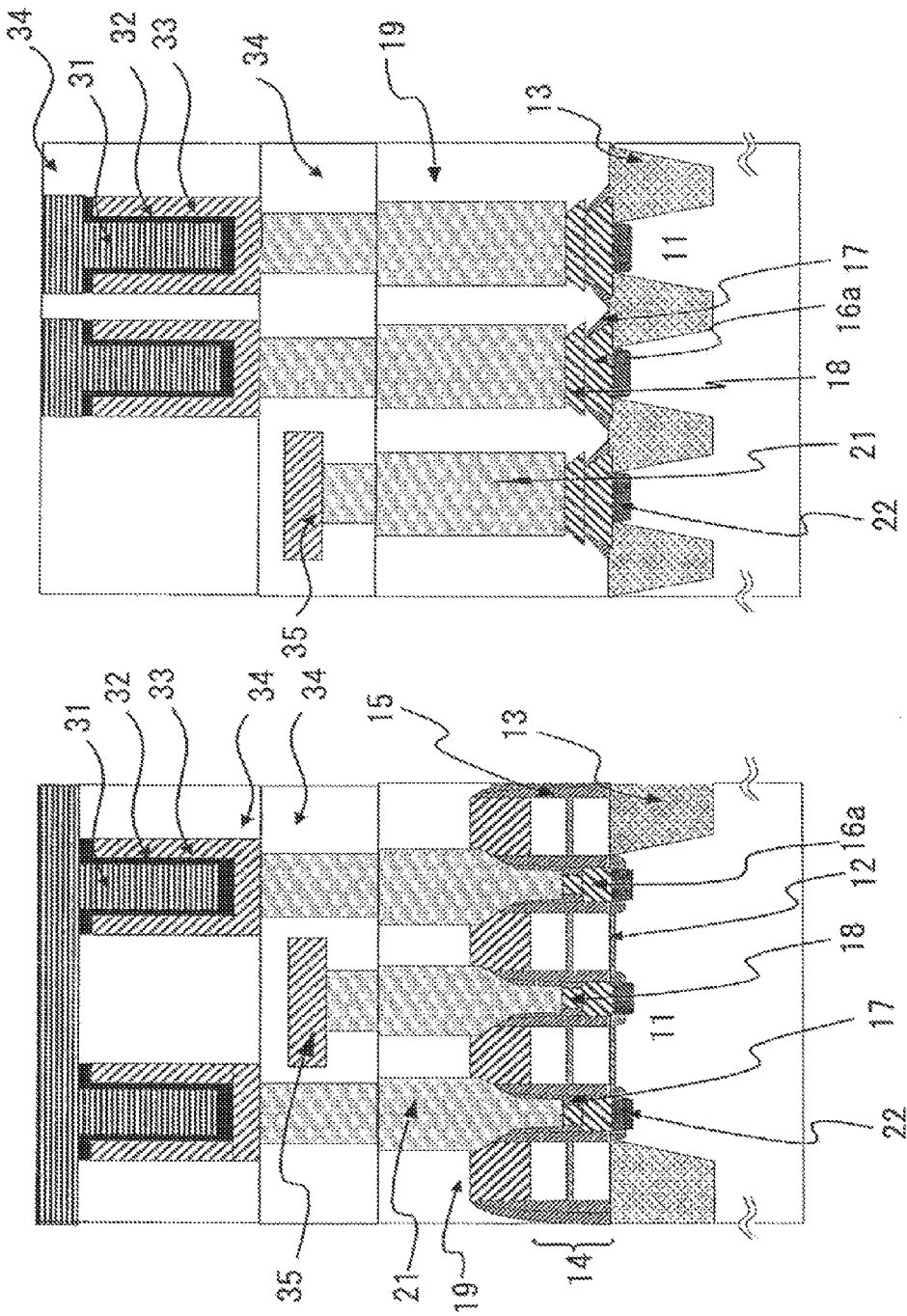

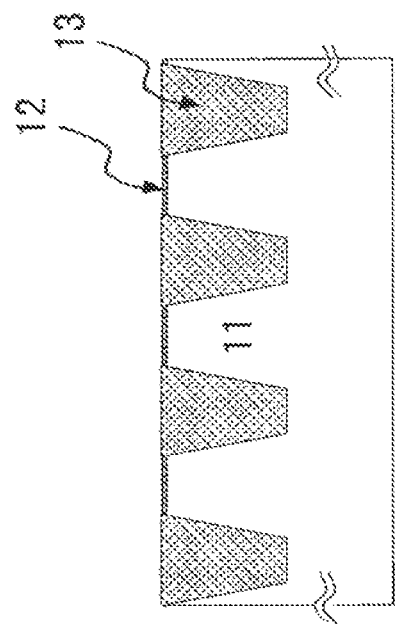
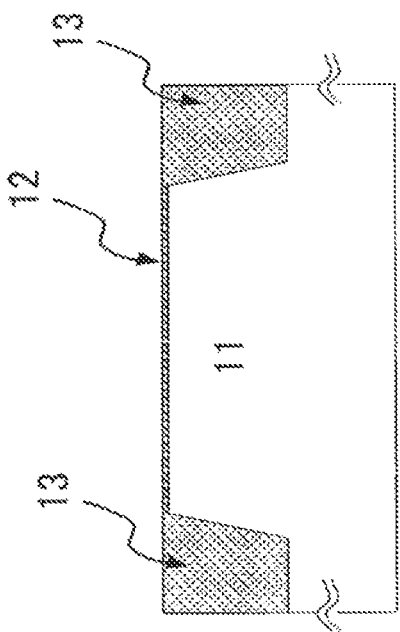

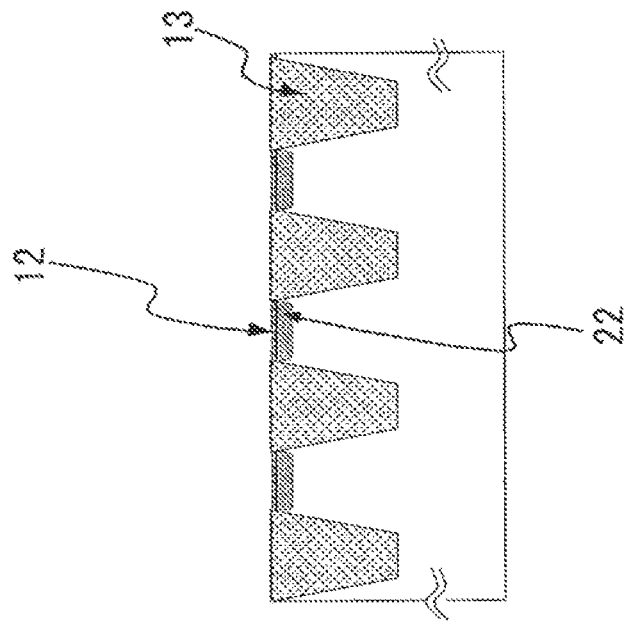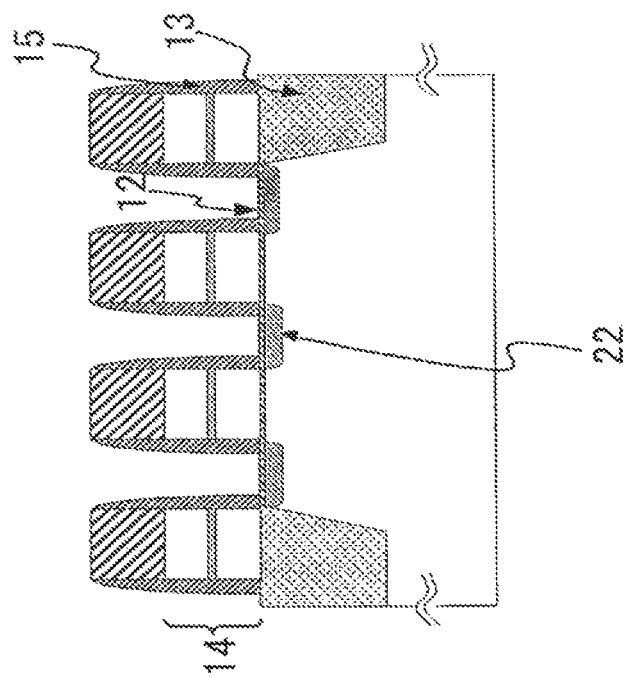

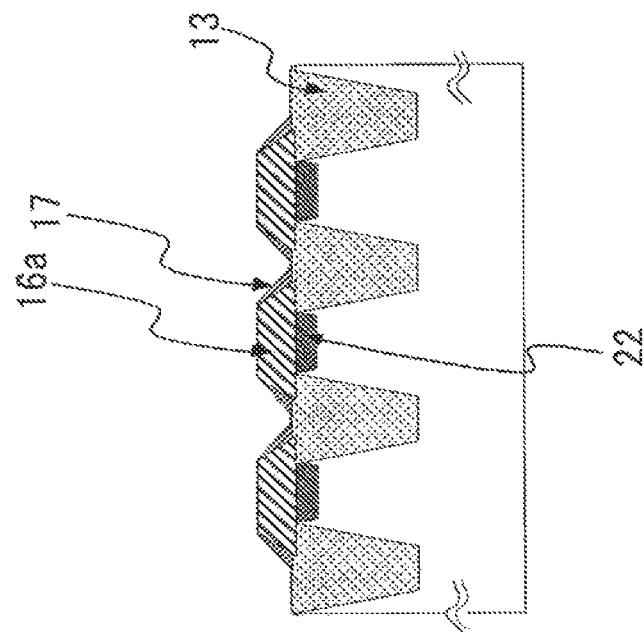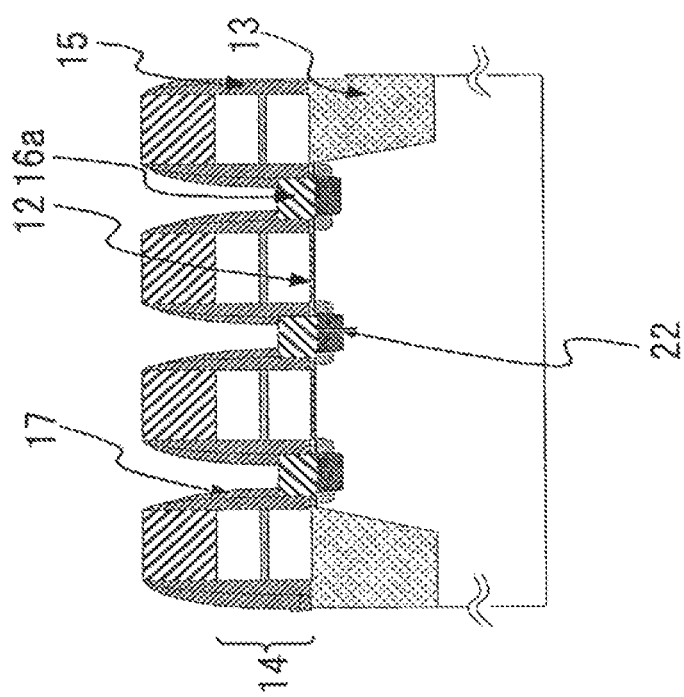

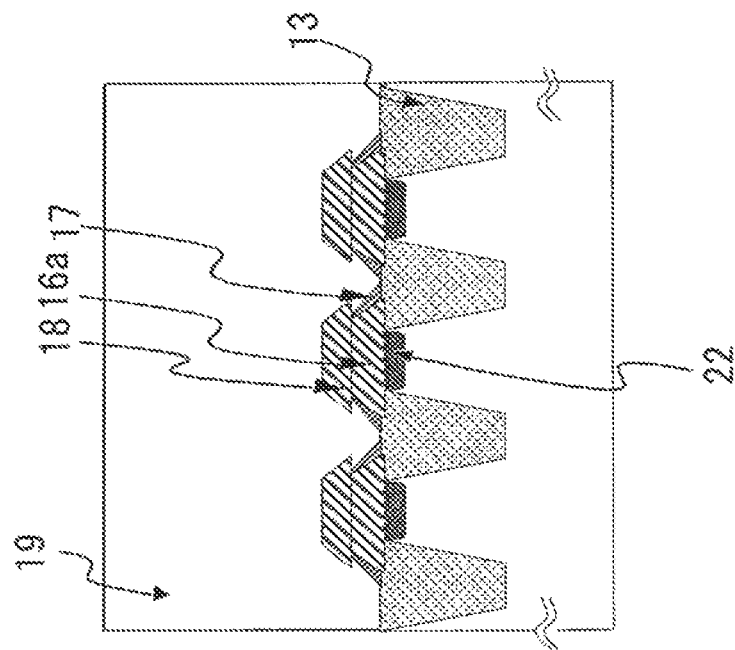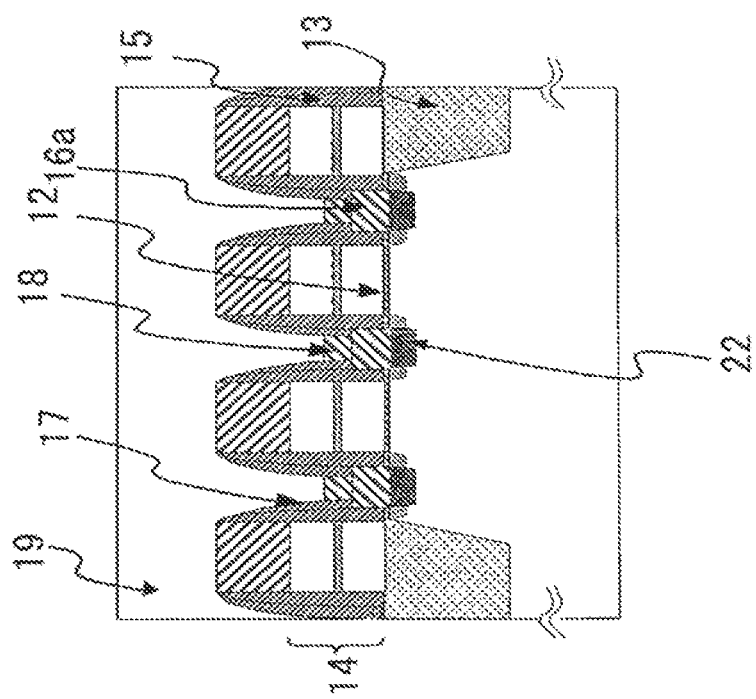

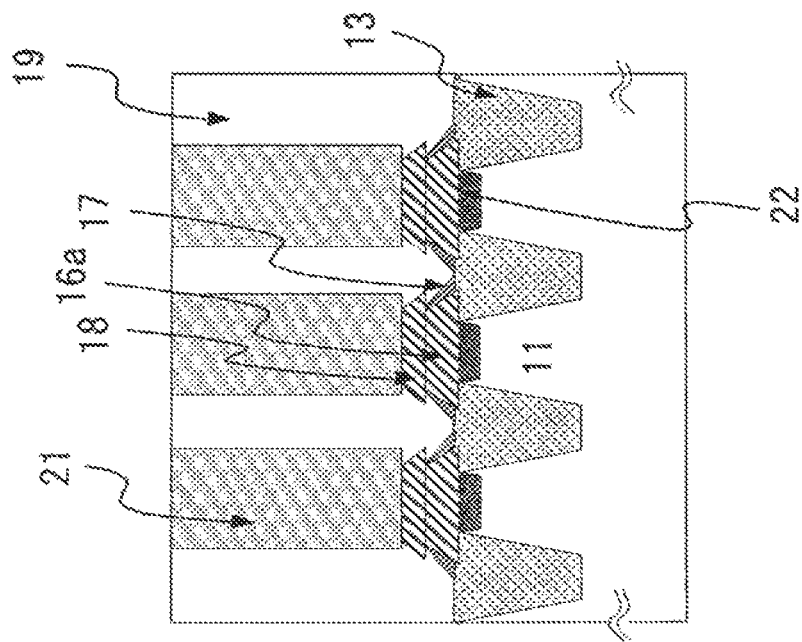
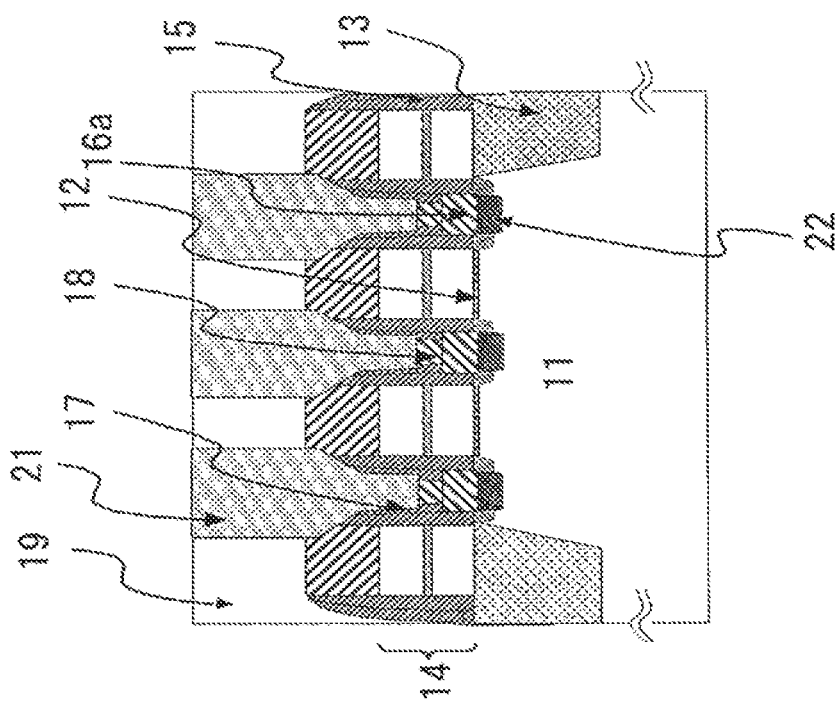
FIG.14A
FIG.14B

SEMICONDUCTOR DEVICE AND METHOD FOR MANUFACTURING THE SAME

This application is a continuation of U.S. patent application Ser. No. 12/711,551, filed Feb. 24, 2010, which is based upon and claims the benefit of priority from Japanese Patent Application No. 2009-061512, filed on Mar. 13, 2009, the contents of which prior applications are incorporated herein in their entirety by reference.

BACKGROUND OF THE INVENTION

Field of the Invention

The present invention relates to a semiconductor device, and a method for manufacturing the semiconductor device.

Description of the Related Art

An SAC (Self-Aligned Contact) technique has been conventionally used to form contact holes. The SAC technique eliminates the need to provide an alignment margin between a gate electrode and a contact hole. The SAC technique is thus used as a method suitable for miniaturization.

The SAC technique generally uses a method utilizing the high etching selectivity of silicon oxide and silicon nitride. According to this method, a silicon nitride film is formed on the top surface and side surfaces of a gate electrode (in this case, the silicon nitride film on the side surfaces of the gate electrode forms sidewalls). Then, etching is carried out using the silicon nitride film as an etching stopper, to form contact holes in a self-aligned manner.

Japanese Patent Laid-Open No. 10-163477 discloses a technique to grow a single silicon layer on an impurity diffusion region by a selective epitaxial growth method. This technique reduces the aspect ratio of the contact holes and thus the etching amount of oxide film dry etching. Thus, a decrease in bottom diameter is avoided, and the short circuit between a contact plug and the gate electrode is prevented.

SUMMARY OF THE INVENTION

In one embodiment, there is provided a method for manufacturing a semiconductor device, the method comprising:

forming an impurity diffusion region in a semiconductor substrate;

forming a first layer on the impurity diffusion region by a selective epitaxial growth method;

forming a second layer on the first layer by the selective epitaxial growth method;

forming an interlayer insulating film all over a surface of the semiconductor substrate;

forming a contact hole penetrating the interlayer insulating film in a thickness direction thereof and reaching the second layer; and filling a conductive material into the contact hole to form a contact plug including the first and second layers and the conductive material.

In another embodiment, there is provided a semiconductor device comprising:

a semiconductor substrate;

an impurity diffusion region provided in the semiconductor substrate; and a contact plug including a first layer, a second layer, and a conductive material region provided on the impurity diffusion region in this order, wherein the first and second layers are formed by a selective epitaxial growth method.

In another embodiment, there is provided a semiconductor device comprising:

a semiconductor substrate;

a diffusion layer formed in the semiconductor substrate;

a first epitaxial layer formed on the diffusion layer, the first epitaxial layer comprising a first bottom surface in contact with the diffusion layer and a first top surface which has a smaller area than the first bottom surface; and a second epitaxial layer formed on the first epitaxial layer, the second epitaxial layer comprising a second bottom surface which has a larger area than the first top surface and which is in contact with the first top surface, and a second top surface which has a smaller area than the second bottom surface.

BRIEF DESCRIPTION OF THE DRAWINGS

The above features and advantages of the present invention will be more apparent from the following description of certain preferred embodiments taken in conjunction with the accompanying drawings, in which:

FIGS. 2A and 2B are diagrams showing the example of the semiconductor device according to the present invention; and FIGS. 3A-3B, 4A-4B, 5A-5B, 6A-6B, 7A-7B, 8A-8B, 9A-9B, 10A-10B, 11A-11B, 12A-12B, 13A-13B, 14A-14B, and 15A-15B are diagrams showing a step of an example of a method for manufacturing a semiconductor device according to the present invention;

Figure 1:
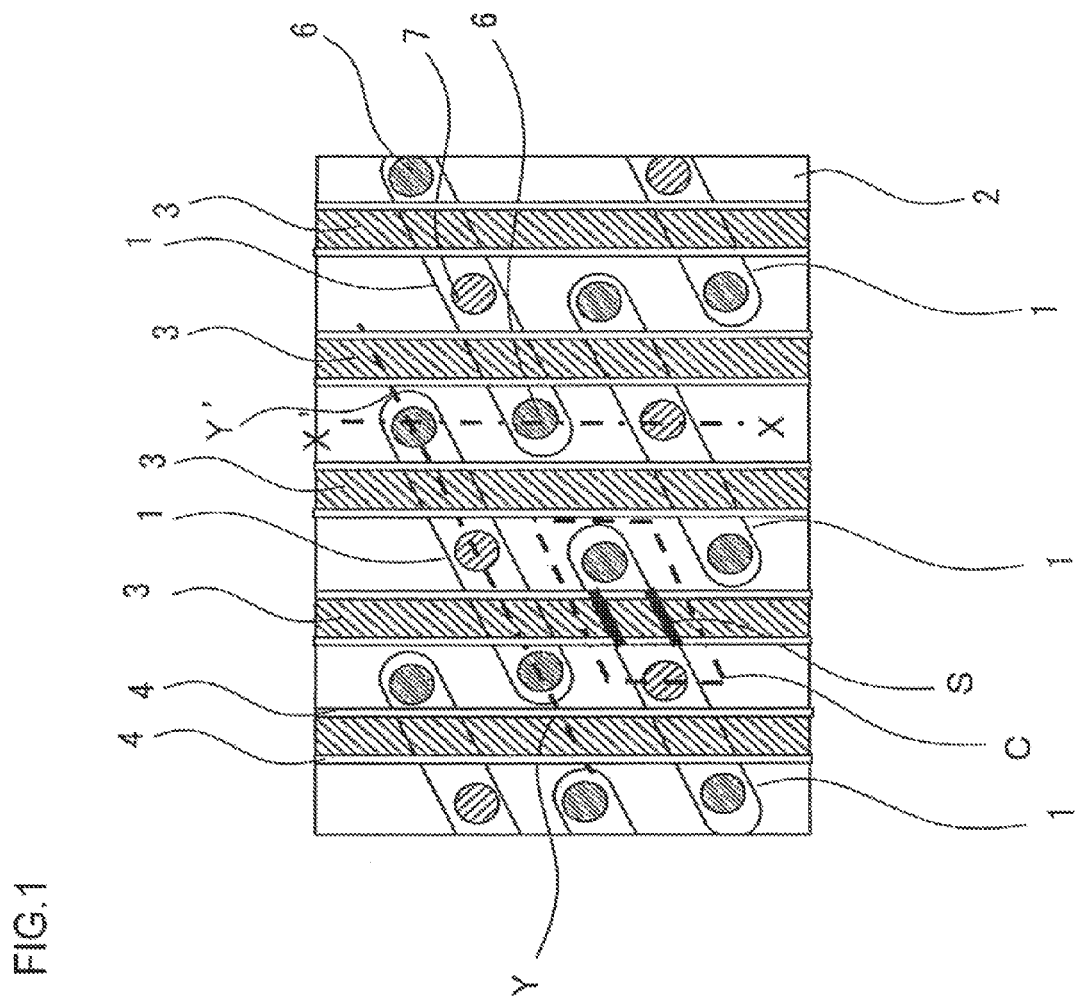
FIG. 1 is a top view showing an example of a semiconductor device according to the present invention.

In the drawings, numerals have the following meanings. 1: semiconductor region, 2: isolation region, 3: gate electrode, 4: sidewall, 6, 7: contact plugs, 11: semiconductor region, 12: gate insulating film, 13: isolation region, 14: gate electrode, 14a: polysilicon layer, 14b: tungsten nitride film layer, 14c: tungsten layer, 14d: silicon nitride film layer, 15: first sidewall, 16: silicon layer, 16a: first silicon layer, 17: second sidewall, 18: second silicon layer, 19: interlayer insulating film, 20: contact, 21: contact plug, 22: impurity diffusion region, 23: contact hole, 31: upper electrode, 32: dielectric film, 33: lower electrode, 34: interlayer insulating film, 35: bit line.

DETAILED DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes.

FIG. 1 is a top view of an example of a semiconductor device according to the present invention. FIG. 1 shows a DRAM (Dynamic Random Access Memory) that is a semiconductor device. In FIG. 1, capacitors and bit lines are omitted.

A semiconductor device in FIG. 1 comprises semiconductor regions 1, isolation regions 2, gate electrodes 3, sidewalls 4 provided on side walls of each gate electrode 3 and formed of silicon nitride film, and contact plugs 6 and 7. In FIG. 1, first sidewalls and second sidewalls are collectively shown as sidewalls 4. Furthermore, contact plugs 6 and 7 schematically show the positions of the contact plugs on semiconductor region 1 and do not exactly correspond to the sectional shape of contact plug 21 in FIG. 2 described below.

As shown in FIG. 1, a plurality of semiconductor regions 1 are regularly arranged on the semiconductor substrate. Semiconductor regions 1 are partitioned by isolation region 2. Furthermore, a plurality of gate electrodes 3 are arranged so as to cross semiconductor regions 1. Gate electrodes 3 function as word lines for a DRAM. Additionally, impurities are ion-implanted in a part of each semiconductor region 1 which is not covered with gate electrode 3, to form an N-type impurity diffusion region or a P-type impurity diffusion region. The impurity diffusion regions function as a source and drain regions of a field effect transistor.

Furthermore, a part of FIG. 1 enclosed by dashed line C forms one field effect transistor. That is, a channel region is formed in a part inside dashed line C which is shown by thick line S. Thus, two field effect transistors are provided in one semiconductor region 1. Additionally, the two field effect transistors share the source or drain regions. Other semiconductor regions 1 are similarly configured.

FIGS. 2A and 2B are sectional views of the semiconductor device in FIG. 1 taken along direction Y-Y' and direction X-X', respectively. As shown in FIG. 2, three N- or P-type impurity diffusion regions 22 are provided in semiconductor region 11. On a part of semiconductor region 11 sandwiched between adjacent impurity diffusion regions 22, gate insulating film 12, gate electrode 14, and silicon nitride film 14*d* (corresponding to a first insulating layer) are provided in this order from the side of semiconductor region 11.

Gate electrode 14 has a three-layer structure including a polysilicon layer, a tungsten nitride film layer, and a tungsten layer laid on top of one another in this order from the side of semiconductor region 11. Furthermore, two layers of sidewalls 15 and 17 are provided on the side surfaces of gate electrode 14 (sidewall 15 corresponds to the first sidewall, and sidewall 17 corresponds to the second sidewall).

The field effect transistor comprises gate insulating film 12, gate electrode 14, source/drain region 22, semiconductor region 11, and the channel region corresponding to a part of semiconductor region 11 sandwiched between a pair of source and drain regions 15.

A constituent material for the gate insulating film is not particularly limited and may be, for example, a silicon oxide film ($SiO_2$), a silicon nitride film ($Si_3N_4$), a silicon oxynitride film, or a stack of these film, or an oxide containing hafnium (Hf). Other examples of the gate insulating film include metal oxide, metal silicate, and a high dielectric-constant insulating film comprising metal oxide or metal silicate doped with nitrogen.

The "high dielectric-constant insulating film" refers to an insulating film with a higher relative permittivity than $SiO_2$, commonly utilized as a gate insulating film in semiconductor devices ($SiO_2$ has a relative permittivity of about 3.6). Typically, the high dielectric-constant insulating film has a relative permittivity of ten to several thousands. Examples of the high dielectric-constant insulating film include HfSiO, HfSiON, HfZrSiO, HfZrSiON, ZrSiO, ZrSiON, HfAlO, HfAlON, HfZrAlO, HfZrAlON, ZrAlO, and ZrAlON.

Furthermore, the gate electrode may comprise a plurality of layers as described above or a single layer. If the gate electrode is a stack, the gate electrode may comprise conductive polysilicon, metal, silicide, or a stack of these materials. The conductive polysilicon can be obtained by mixing impurities into polysilicon. In this case, the impurities preferably have a concentration of $1.0 \times 10^{20}$ to $1.0 \times 10^{21}/$cm$^3$. Examples of the impurities may include phosphorous, arsenic, and boron.

Additionally, a material for the gate electrode may be silicide. Specific examples of the silicide may include NiSi, $Ni_2Si$, $Ni_3Si$, $NiSi_2$, WSi, $TiSi_2$, $VSi_2$, $CrSi_2$, $ZrSi_2$, $NbSi_2$, $MoSi_2$, $TaSi_2$, CoSi, $CoSi_2$, PtSi, $Pt_2Si$, and $Pd_2Si$.

Impurity diffusion region 22 in semiconductor region 11 is electrically connected to contact plugs 6 and 7. Contact plugs 6 and 7 partly comprise first silicon layer 16*a* (corresponding to a first layer) and second silicon layer 18 (corresponding to a second layer) formed on first silicon layer 16*a*. Moreover, a conductive material is formed on second silicon layer 18. First silicon layer 16*a*, second silicon layer 18, and conductive material form contact plug 21.

First silicon layer 16*a* is formed by the selective epitaxial growth method and is in contact with sidewall 15. Furthermore, sidewall 17 is further formed on sidewall 15 positioned over first silicon layer 16*a*. Second silicon layer 18 is formed by the selective epitaxial growth method and is in contact with sidewall 17. That is, one layer of sidewall 15 is present between first silicon layer 16*a* and gate electrode 14. Furthermore, two layers of sidewalls 15 and 17 are present between second silicon layer 18 and gate electrode 14.

Sidewalls 15 and 17 may be formed of the same material or different materials but need to be made of an insulating material. A material for sidewalls 15 and 17 may be a silicon nitride film.

Thus, the provision of sidewalls 15 and 17 allows first silicon layer 16*a* and second silicon layer 18 to be prevented from being short-circuited with gate electrode 14. Furthermore, the provision of silicon nitride film 14*d* (first insulating layer) allows the conductive material forming the contact plug to be prevented from being short-circuited with gate electrode 14.

Moreover, when second silicon layer 18 is formed on first silicon layer 16*a*, the silicon layer is also formed on the sidewall of first silicon layer 16*a*. Here, in the present example, first silicon layer 16*a* is protected by sidewall 17. Thus, silicon can be prevented from being formed in the lateral direction of first silicon layer 16*a*. As a result, first silicon layers 16*a* arranged adjacent to each other in a direction (direction X-X' in FIG. 1) parallel to the direction in which gate electrodes 14 are arranged are prevented from being short-circuited with each other.

In the semiconductor device in the present example, two silicon layers 16*a* and 18 are stacked on impurity diffusion region 22. Thus, the silicon layer can be formed to be thick (high) while being inhibited from growing in the lateral direction. Hence, when contact holes are subsequently formed on the silicon layer by SAC etching, the etching amount can be reduced to increase a margin required to prevent contact plugs 15 and 17 from being short-circuited with gate electrode 14. As a result, further miniaturized semiconductor device can be obtained. Furthermore, the time for which silicon nitride film 14*d* (first insulating layer) is exposed to SAC etching can be reduced. Consequently, contact plugs 15 and 17 can be prevented from being short-circuited with gate electrode 14 as a result of degradation of silicon nitride film 14*d*.

At least three layers (for example, at least three silicon layers) may be provided on impurity diffusion region 22. The provision of at least three silicon layers enables a reduction in the depth of the contact holes and thus in aspect ratio. As a result, the margin required for preventing short circuiting can be increased, allowing miniaturization to be more effectively achieved.

The conductive material formed on second silicon layer 18 may contain at least one type of metal selected from a group consisting of tungsten (W), tungsten nitride (WN), titanium (Ti), titanium nitride (TiN), tantalum (Ta), tantalum nitride (TaN), cobalt (Co), copper (Cu), aluminum (Al), copper alloy, and aluminum alloy.

In FIG. 2A, two drivable field effect transistors are present for one semiconductor region 11 and share the source or drain regions located halfway between the field effect transistors. The central source or drain regions shared by the two field effect transistors is electrically connected to bit lines via contact plugs. Furthermore, each field effect transistor includes the source or drain regions on the respective opposite sides thereof. The source or drain regions arranged on the respective opposite sides of the field effect transistor are electrically connected to capacitors via contact plugs.

Each of the capacitors is formed so as to sandwich dielectric film 32 between upper electrode 31 and lower electrode 33. Charges can be accumulated in dielectric film 32. The accumulation of charges allows information to be written. Then, turning on the field effect transistor shown in FIG. 2A allows determination, via bit line 35, of whether or not charges are accumulated in the capacitor. The determination of whether or not charges are accumulated allows information to be read. The field effect transistor and the capacitor form a memory cell for a DRAM (Dynamic Random Access Memory). FIG. 2A shows two memory cells.

With reference to FIG. 2, the semiconductor device with the DRAM has been described. However, the semiconductor device according to the present invention can be used for applications other than a memory cell for a DRAM. For example, the above-described field effect transistor, contact plug, and bit line can be combined with a storage element that utilizes a variation in resistance value, to form a memory cell for a phase change memory (PRAM) or a resistance memory (ReRAM). Specifically, the phase change memory may be formed as follows. A chalcogenide material (GeSbTe), which has a resistance value varying depending on the phase, is used to form a storage element by well-known means. The storage element is connected to one of the source and drain regions of the field effect transistor, whereby forming the memory cell. Then, the state (resistance value) of the storage element can be determined based on the value of a current flowing while the transistor is on.

Now, a method for manufacturing the semiconductor device shown in FIGS. 1 and 2 will be described with reference to FIGS. 3 to 14. One of two figures included in each of FIGS. 3 to 14 which has reference character A shows a part of the semiconductor device which corresponds to a cross section taken along line Y-Y' in FIG. 1. The other figure with reference character B shows a part of the semiconductor device which corresponds to a cross section taken along line X-X' in FIG. 1.

First, as shown in FIG. 3A-3B, STIs (Shallow Trench Isolations) were formed on the silicon semiconductor substrate as isolation regions 13 to partition transistor formation region 11. Then, transistor formation region 11 was oxidized to form gate insulating film 12.

Figure 4B:
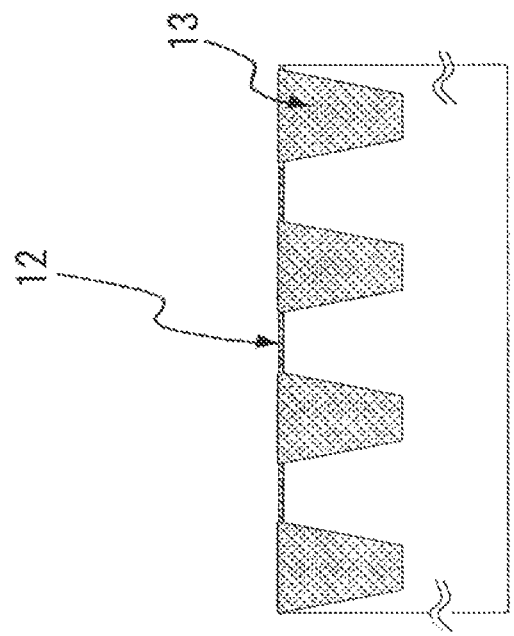
Figure 4A:
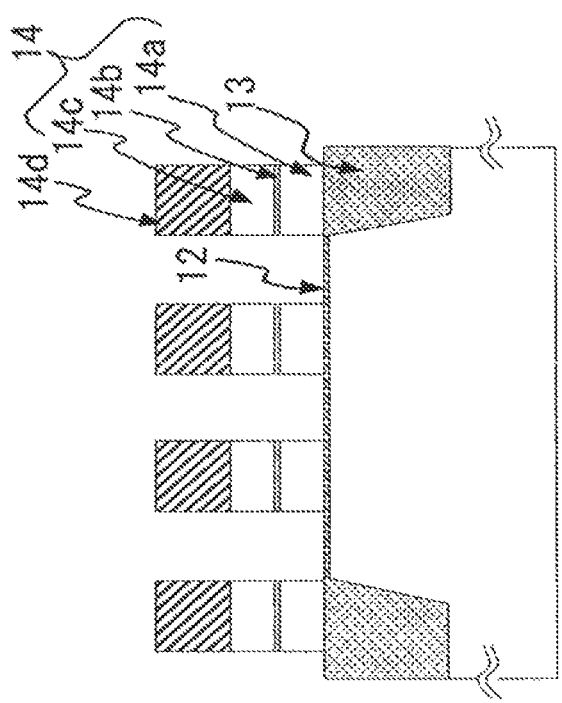

Then, as shown in FIG. 4A-4B, polysilicon layer 14a, tungsten nitride layer 14b, tungsten layer 14c, and silicon nitride film layer 14d were stacked on gate insulating film 12 in this order. Thereafter, silicon nitride film layer 14d was processed by a photolithography technique to form a mask pattern of silicon nitride film layer 14d. Tungsten layer 14c, tungsten nitride layer 14b, and polysilicon layer 14a were then dry-etched through the mask pattern of silicon nitride film layer 14d as a mask. Thus, gate electrode 14 comprising polysilicon layer 14a, tungsten nitride layer 14b, and tungsten layer 14c, as well as silicon nitride film layer 14d (corresponding to first insulating film) were formed on gate insulating film 12 in this order.

Figure 5B:
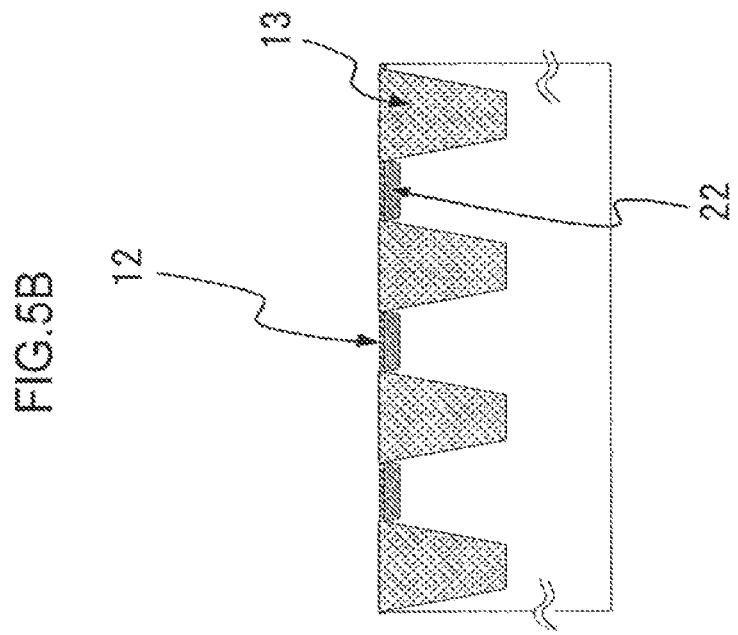
Figure 5A:
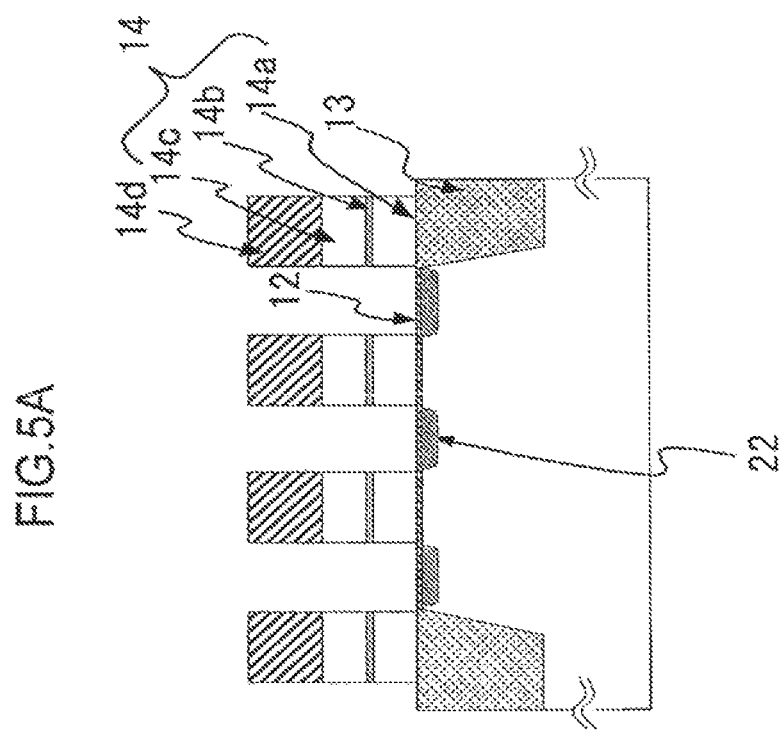

Then, as shown in FIG. 5A-5B, impurities were implanted in transistor formation region 11 by an ion implantation method through silicon nitride film layer 14d and gate electrode 14 as a mask. An impurity diffusion region ($n^-$) with a low impurity concentration was thus formed.

Then, as shown in FIG. 6A-6B, a silicon nitride film was deposited all over the surface of transistor formation region 11 by a CVD method or the like, and then etched back by dry etching to form sidewalls 15 (corresponding to the first sidewall) on the opposite side surfaces of each of silicon nitride film layer 14d and gate electrode 14.

Figure 7A:
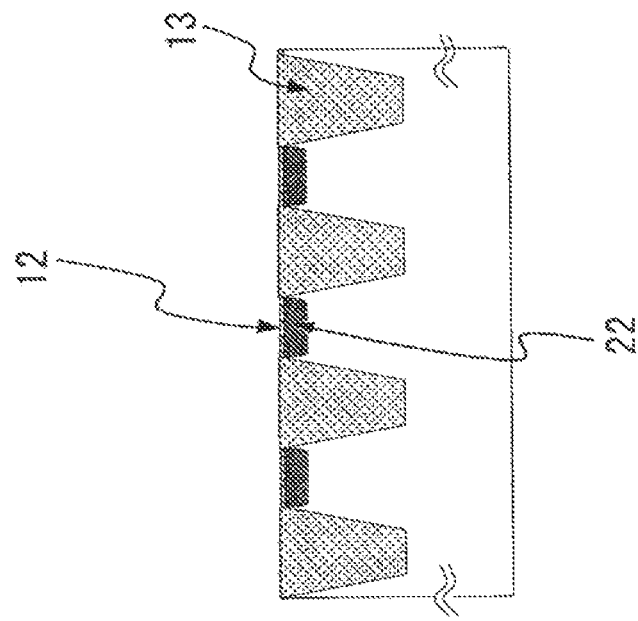
Figure 7B:
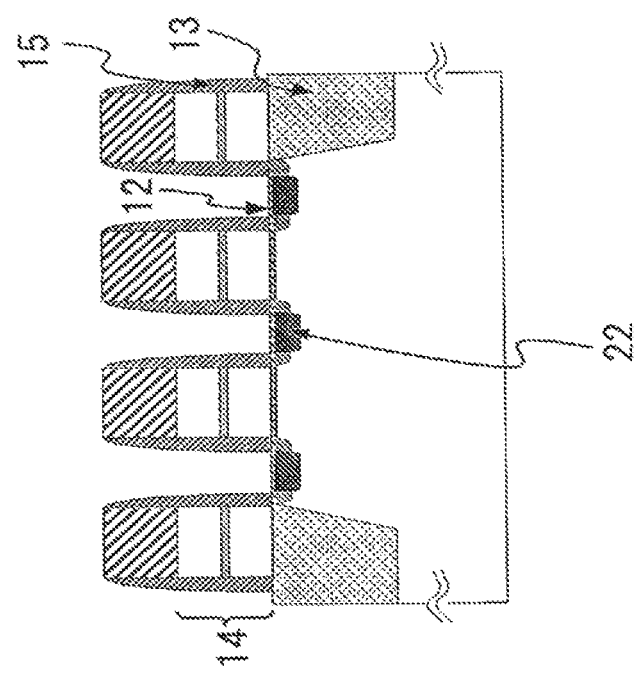

Then, as shown in FIG. 7A-7B, impurities were implanted by ion implantation through silicon nitride film layer 14d, gate electrode 14, and sidewall 15 as a mask. An impurity diffusion region ($n^+$) with a high impurity concentration was thus formed. The impurity diffusion regions ($n^-$) and ($n^+$) function as a source region and drain regions.

Figure 8B:
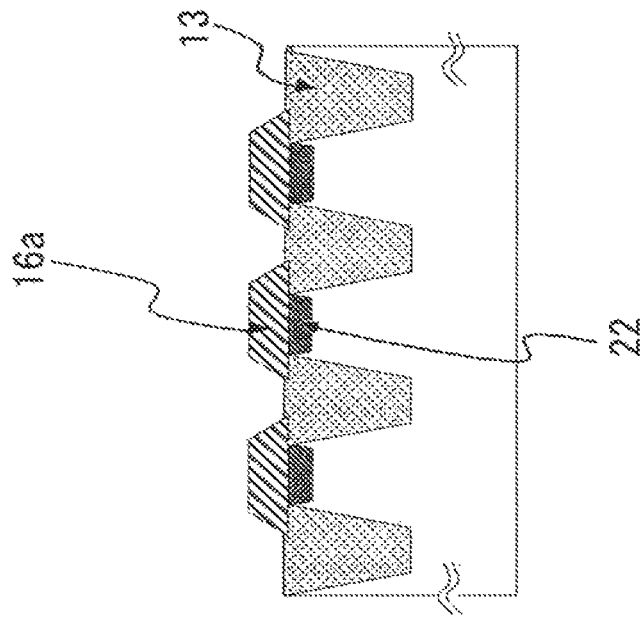
Figure 8A:
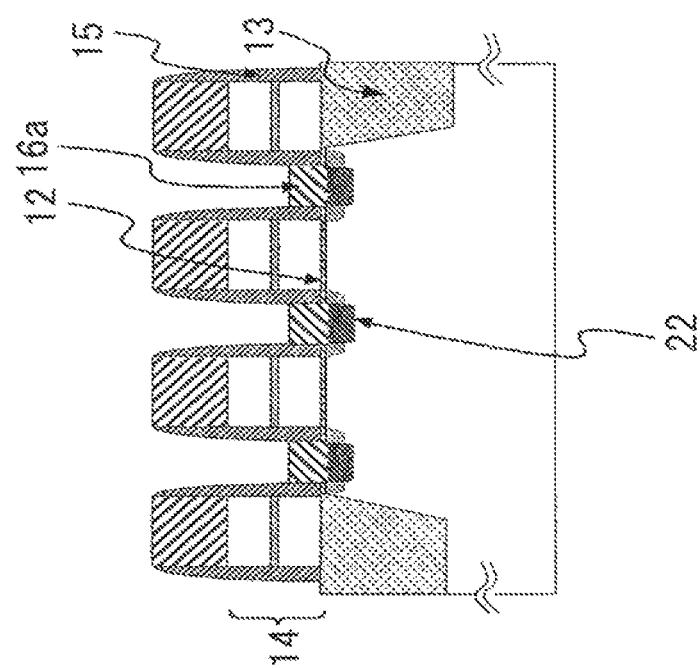

Then, as shown in FIG. 8A-8B, gate insulating film 12 on the impurity diffusion region ($n^+$) was removed by wet etching or the like, and first silicon layer 16a was then formed on the impurity diffusion region ($n^+$) by the selective epitaxial growth method. Conditions for the selective epitaxial growth method are as follows.

Temperature: 780° C.,

Pressure: 10 Torr,

Gas flow rate: $H_2$ 19 slm, $SiH_2Cl_2$ 70 sccm, HCl 40 sccm, and

Treatment time: 450 sec.

A target value for the thickness of first silicon layer 16a was equivalent to the dimension of the space between gate electrodes; the thickness was set to 60 nm for the above-described treatment time.

Figure 9A:
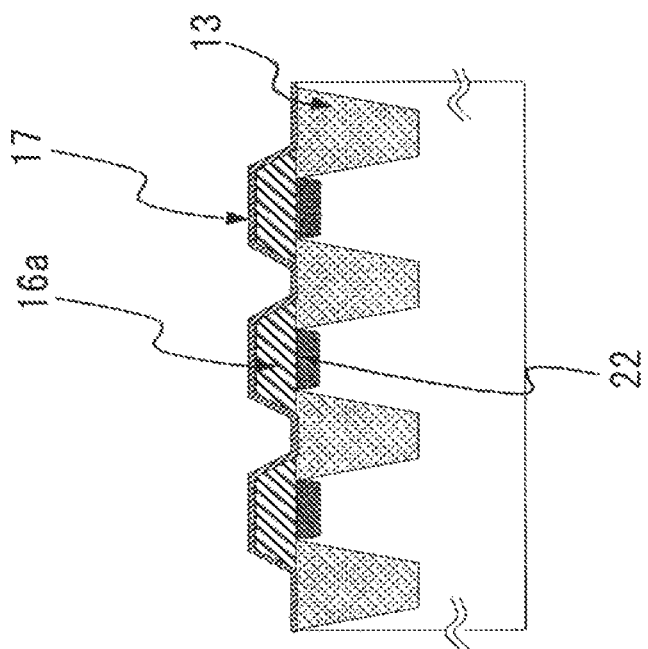
Figure 9B:
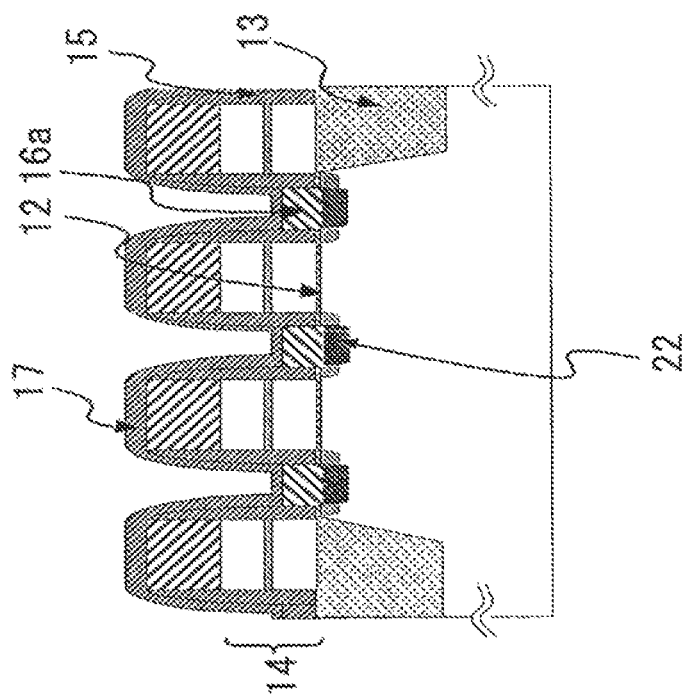

Then, as shown in FIG. 9A-9B, silicon nitride film 17 (corresponding to a second insulating layer) was deposited on transistor formation region 11 to a thickness of, for example, 10 to 30 nm by the CVD method or the like.

Thereafter, as shown in FIG. 10A-10B, silicon nitride film 17 was etched back by dry etching so that the side surface of sidewall 15 was covered with silicon nitride film 17. Thus, sidewall 17 (corresponding to a second sidewall) was formed on sidewall 15.

Conditions for the etch-back were as follows.

Pressure: 50 mTorr,

RF: 600 W, and

Gas: $CF_4$ 100 sccm.

Thus, when second silicon layer 18 is formed, silicon of first silicon layer 16a can be prevented from being formed in the lateral direction. As a result, first silicon layers 16a arranged adjacent to each other in a direction (direction X-X' in FIG. 1) parallel to the direction in which gate electrodes 14 are arranged are prevented from being short-circuited with each other.

Figure 11B:
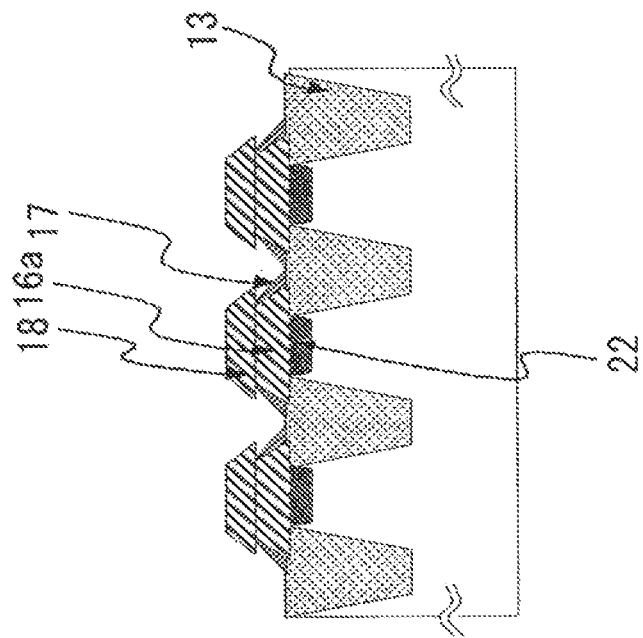
Figure 11A:
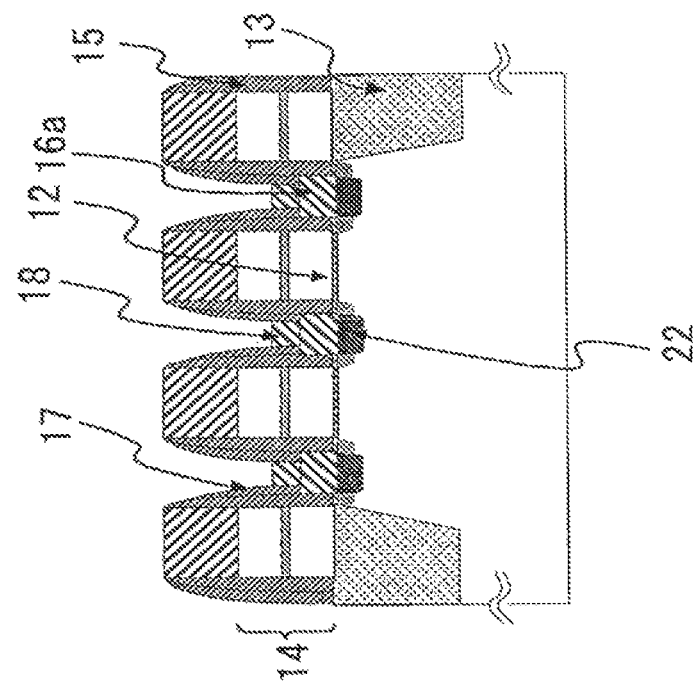

Then, as shown in FIG. 11A-11B, second silicon layer 18 was formed on first silicon layer 16a by the selective epitaxial growth method. In this case, treatment conditions were the same as those for first silicon layer 16a.

Thereafter, as shown in FIG. 12A-12B, BPSG (Bror-PhosphoSilicate Glass) was deposited all over the resultant surface. BPSG was then thermally treated to form interlayer insulating film 19. Simultaneously with the thermal treatment, the ion-implanted impurities were also thermally treated. The thermal treatment steps for BPSG and impurities need not be carried out together but may be separately carried out.

Figure 13A:
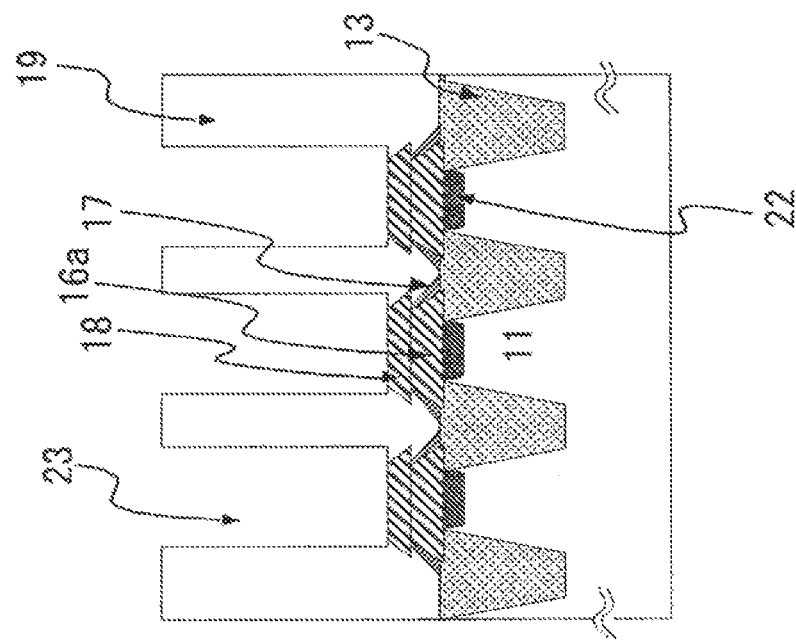
Figure 13B:
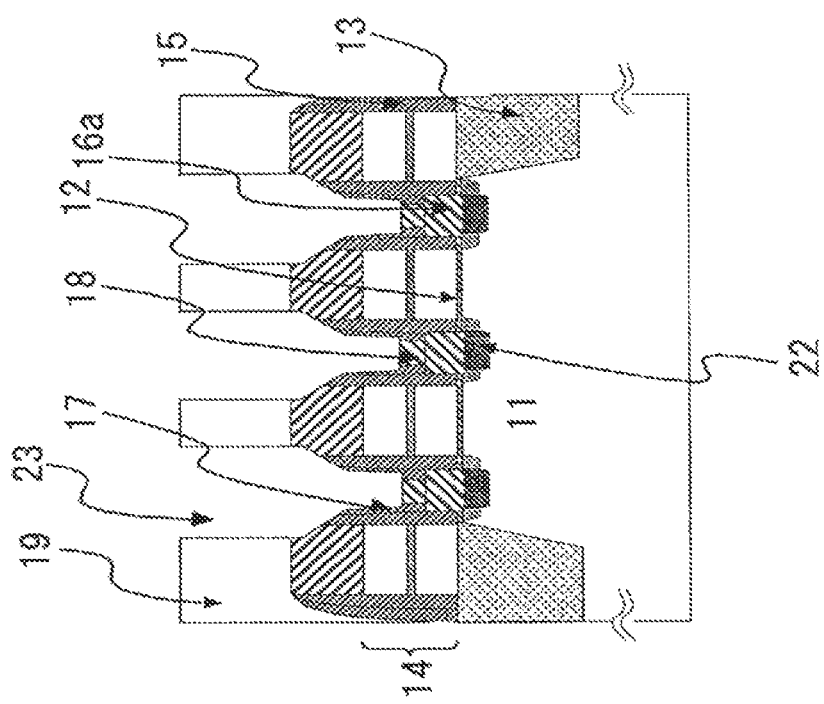
Figure 15A:
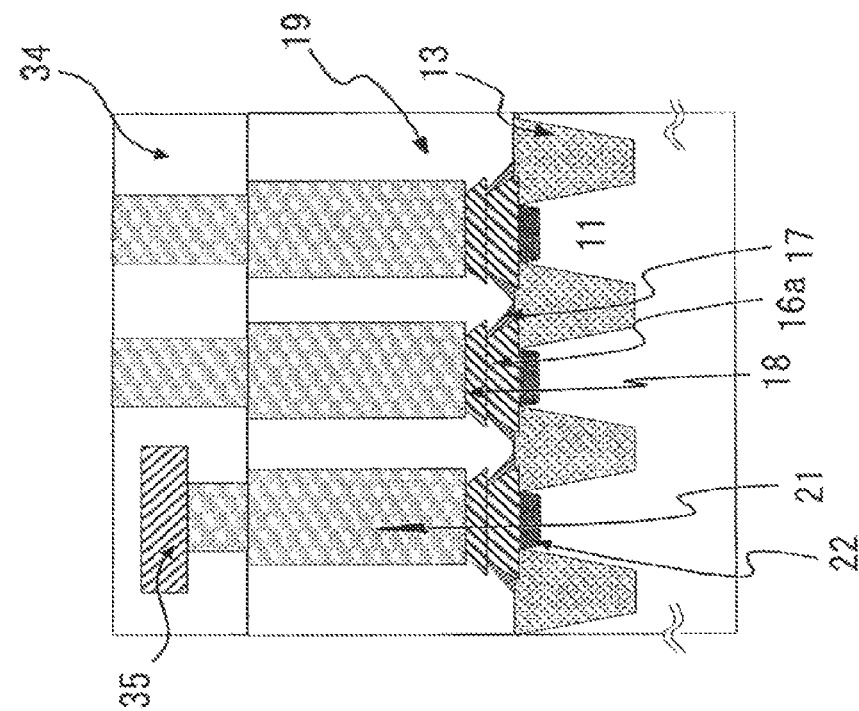
Figure 15B:
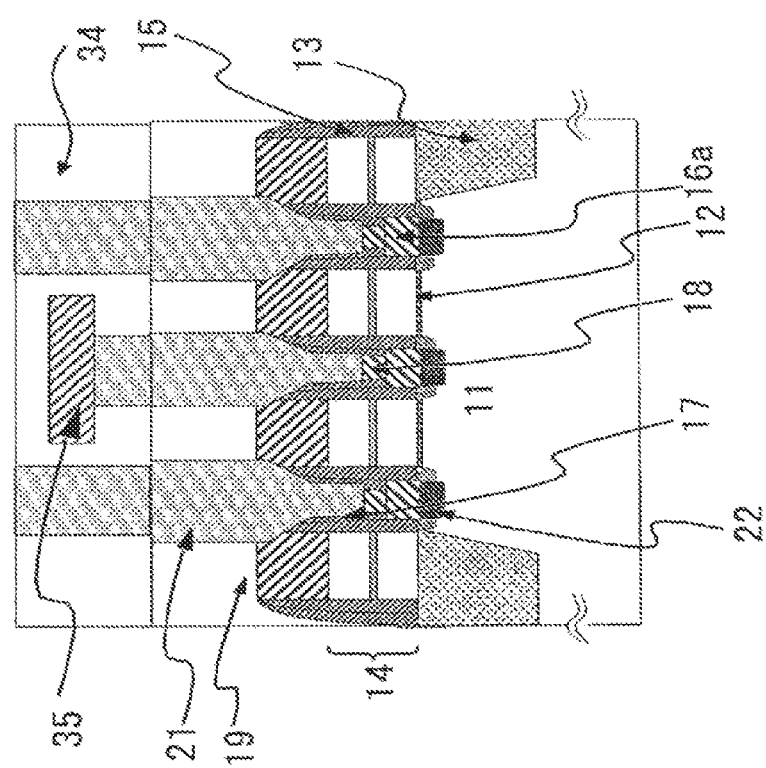

Then, as shown in FIG. 13A-13B, a resist mask (not shown in the drawings) was formed on interlayer insulating film 19 by the lithography technique. Thereafter, SAC dry etching was carried out using the resist mask in such a manner that interlayer insulating film 19 had a higher etching selectivity than silicon nitride film layer 14$d$ and sidewalls 15 and 17. Contact holes 23 were then formed so as to expose second silicon layer 18. In this case, as shown in FIG. 13A, the contact holes were formed in a self-aligned manner with respect to second silicon layer 18 provided between the adjacent gate electrodes. The mask for the SAC dry etching may be a stack mask of polysilicon and amorphous carbon and the like. Furthermore, the SAC dry etching may be carried out using fluorocarbon etching gas such as $C_4F_6$, $C_4F_8$, or $C_5F_8$ under, for example, the following treatment conditions.

Pressure: 30 mTor,
Gas flow rate: $C_5F_8/O_2/Ar=25/20/500$ sccm,
Source RF: 2,500 W, and
Bias RF: 2,500 W.

Then, as shown in FIG. 14A-14B, a conductive material such as polysilicon, TiN, or W was stacked on second silicon layer 18 to form contact plugs 21. Furthermore, bit line 35 was formed so as to be electrically connected to predetermined contact plug 21. Thereafter, capacitors were formed so as to be electrically connected to contact plugs 21 not connected to bit line 35. Thus, the semiconductor device shown in FIGS. 2A and 2B was formed. The semiconductor device functions as a DRAM (Dynamic Random Access Memory).

In the present exemplary embodiment, two silicon layers are formed by the selective epitaxial growth method. However, three or more silicon layers may be formed. In this case, the silicon layers other than the first and second silicon layers are not in direct contact with the sidewall.

It is apparent that the present invention is not limited to the above embodiments, but may be modified and changed without departing from the scope and spirit of the invention.

What is claimed is:

1. A semiconductor device comprising:
   a semiconductor substrate;
   a diffusion layer formed in the semiconductor substrate as a source/drain region of a field effect transistor;
   a first epitaxial layer formed on the diffusion layer, the first epitaxial layer comprising a first bottom surface in contact with the diffusion layer, and a first top surface;
   a second epitaxial silicon layer formed on the first epitaxial layer, the second epitaxial silicon layer comprising a second bottom surface which is in contact with the first top surface, and a second top surface; and
   a contact plug on the second epitaxial silicon layer, the contact plug being in contact with the second top surface of the second epitaxial silicon layer;
   the first epitaxial layer including a first side surface having an upper end; and
   the second epitaxial silicon layer including a second side surface projecting from the upper end of the first side surface of the first epitaxial layer so that a step is provided between the first side surface of the first epitaxial layer and the second side surface of the second epitaxial silicon layer.

2. The semiconductor device according to claim 1, further comprising first and second gate electrodes,
   wherein the first epitaxial layer and second epitaxial silicon layer are sandwiched between the first and second gate electrodes.

3. The semiconductor device according to claim 2, further comprising a capacitor formed on the contact plug.

4. The semiconductor device according to claim 3,
   wherein the diffusion layer is a first diffusion layer and the contact plug is a first contact plug, and
   the semiconductor device further comprises:
   a second diffusion layer formed in the semiconductor substrate;
   a third epitaxial layer formed on the second diffusion layer, the third epitaxial layer comprising a third bottom surface in contact with the second diffusion layer and a third top surface which has a smaller area than the third bottom surface;
   a fourth epitaxial layer formed on the third epitaxial layer, the fourth epitaxial layer comprising a fourth bottom surface which has a larger area than the third top surface and which is in contact with the third top surface, and a fourth top surface which has a smaller area than the fourth bottom surface;
   a second contact plug formed on the fourth epitaxial layer, the second contact plug being in contact with the fourth top surface of the fourth epitaxial layer; and
   a bit line formed on the second contact plug.

5. A semiconductor device comprising:
   a semiconductor substrate;
   a first gate electrode provided on the semiconductor substrate and extending in a direction;
   a second gate electrode provided on the semiconductor substrate and extending in the direction;
   a first contact plug provided on the semiconductor substrate and between the first and second gate electrodes, the contact plug comprising a first epitaxial layer and a second epitaxial silicon layer formed on the first epitaxial layer; and
   a second contact plug provided on the semiconductor substrate and between the first and second gate electrodes, the second contact plug being placed adjacent to the first contact plug and comprising a first epitaxial layer and a second epitaxial silicon layer formed on the first epitaxial layer of the second contact plug,
   the first epitaxial layer of the first contact plug including a first side surface facing the first gate electrode;
   the first epitaxial layer and second epitaxial silicon layer of the first contact plug each including a second side surface facing a side surface of the first epitaxial layer and second epitaxial silicon layer of the second contact plug;
   the second side surface of the first epitaxial layer of the first contact plug having an upper end; and
   the second side surface of the second epitaxial silicon layer of the first contact plug projecting from the upper end of the second side surface of the first epitaxial layer toward the second contact plug so that a step is provided between the second side surfaces of the first epitaxial layer and second epitaxial silicon layer of the first contact plug.

6. The semiconductor device as claimed in claim 5, further comprising:
   an isolation region on the semiconductor substrate and provided between the first and second contact plugs, the second side surface of the first epitaxial layer having a lower end provided on the isolation region.

7. The semiconductor device as claimed in claim 5, wherein none of a gate electrode is provided between the first and second contact plugs.

8. The semiconductor device as claimed in claim 5, wherein the second epitaxial silicon layer includes a first bottom surface and the first epitaxial layer includes a first top surface, and wherein the first bottom surface has an area larger than an area of the first top surface.

9. The semiconductor device as claimed in claim 8, wherein the second epitaxial silicon layer includes a second top surface having an area smaller than the area of the first bottom surface.

10. The semiconductor device as claimed in claim 9, wherein the first epitaxial layer includes a second bottom surface having an area larger than the area of the first top surface.

11. The semiconductor device as claimed in claim 5, further comprising:
    an insulating film covering the second side surface of the first epitaxial layer so that the second side surface of the second epitaxial silicon layer is free from being covered with the insulating film.

12. The semiconductor device according to claim 1, further comprising a first gate electrode and a first sidewall located between the first epitaxial layer and the first gate electrode.

13. The semiconductor device according to claim 1, further comprising a first gate electrode, a first sidewall and a second side wall, the first and second side walls being located between the second epitaxial silicon layer and the first gate electrode.

14. The semiconductor device according to claim 13, wherein each of the first and second sidewalls includes a silicon nitride film.

15. The semiconductor device according to claim 5, further comprising a first sidewall located between the first epitaxial layer and the first gate electrode.

16. The semiconductor device according to claim 5, further comprising a first sidewall and a second side wall, the first and second side walls being located between the second epitaxial silicon layer and the first gate electrode.

17. The semiconductor device according to claim 16, wherein each of the first and second sidewalls includes a silicon nitride film.

\* \* \* \* \*